United States Patent [19]

Börner

[11] Patent Number: 5,698,858

[45] Date of Patent: Dec. 16, 1997

[54] SOLID-STATE IMAGE INTENSIFIER AND X-RAY EXAMINATION APPARATUS COMPRISING A SOLID-STATE IMAGE INTENSIFIER

[75] Inventor: Herbert Friedrich Börner, Hamburg, Germany

[73] Assignee: U.S. Philips Corporation, New York, N.Y.

[21] Appl. No.: 513,330

[22] Filed: Aug. 10, 1995

[30] Foreign Application Priority Data

Aug. 11, 1994 [DE] Germany .............. 44 28 450.0
Aug. 17, 1994 [EP] European Pat. Off. .......... 94202340

[51] Int. Cl.⁶ .................... H01L 31/00; H05B 33/14
[52] U.S. Cl. ............... 250/484.2; 250/214 LA; 378/98.8
[58] Field of Search ............... 250/484.2, 214 LA, 250/483.1; 378/98.8

[56] References Cited

U.S. PATENT DOCUMENTS

| | | | |
|---|---|---|---|
| 310,408 | 8/1885 | Taylor | 250/214 LA X |
| 3,543,032 | 11/1970 | Kazan . | |
| 3,699,346 | 10/1972 | Harwood et al. | 250/214 LA |
| 3,710,181 | 1/1973 | Tanaka et al. . | |
| 3,870,892 | 3/1975 | Fass et al. | 250/483.1 |
| 4,503,460 | 3/1985 | Sklebitz . | |
| 5,247,190 | 9/1993 | Friend et al. | 257/40 |

OTHER PUBLICATIONS

"Light–emitting Diodes Based On Conjugated Polymers", by J.H. Burroughs et al, Letters to Nature, vol. 347, Oct. 11, 1990, pp. 539–541.

*Primary Examiner*—Edward J. Glick
*Attorney, Agent, or Firm*—Jack D. Slobod

[57] ABSTRACT

A solid-state image intensifier is provided with a thin film photoconductive layer and an electroluminescent layer which contains a polymer light emitting diode (LED) material. The photoconductive layer is a thin film which does not suffer from electrical breakdown because a low voltage is applied to the electrodes, said low voltage being sufficient to cause luminescence of the electroluminescence layer. As the photoconductive layer is thin the time response of the solid state image intensifier is shortened and its spatial resolution is improved. The color of the light given off by the polymer LED material is controlled by suitable chemical substitutions to the polymer. Consequently, the color of the light given off may be adapted to the color dependence of the sensitivity of an image sensor for detecting the output light of the solid-state image intensifier.

20 Claims, 1 Drawing Sheet

SOLID-STATE IMAGE INTENSIFIER AND X-RAY EXAMINATION APPARATUS COMPRISING A SOLID-STATE IMAGE INTENSIFIER

BACKGROUND OF THE INVENTION

1. Field of the Invention

The invention relates to a solid-state image intensifier comprising a pair of spaced apart electrodes and a photoconductive layer coupled to an electroluminescent layer which are positioned in the space between the electrodes. The invention also relates to an x-ray examination apparatus comprising such a solid-state image intensifier.

2. Description of the Related Art

A device of said kind may be used to increase brightness and/or to change the wavelength of an image of radiation to which the photoconductive layer is responsive. The radiation may, for example, include x-ray, infrared, ultraviolet or visible radiation.

A solid-state image intensifier of said kind is known from the U.S. Pat. No. 3,543,032.

The known solid-state image intensifier is operated by applying a high DC or AC voltage to the electrodes. When no radiation is incident on the solid-state image intensifier, the applied voltage is distributed almost entirely across the photoconductive layer, whereas only a small voltage drop is across the electroluminescent layer. When the solid-state image intensifier is irradiated, the photoconductive layer becomes locally conductive at positions where radiation is incident and consequently, the voltage drop across the irradiated portions of the photoconductive layer decreases. At those positions the voltage drop across the electroluminescent layer increases, which causes the electroluminescent layer to locally emit radiation. The electroluminescent material of the known device requires a high voltage to cause the electroluminescent layer to emit radiation. In particular, it is mentioned to use a composition of copper chloride and manganese zinc chloride as an electroluminescent material and to apply a voltage of several hundreds of Volts. Because such a high voltage is used, the photoconductive layer of the known device is rather thick so as to avoid electrical breakdown therein. When the known solid-state image intensifier is operated at an alternating high voltage, the electroluminescent layer must be rather thick to avoid an AC-short circuit of the electroluminescent layer bypassing the resistance of the electroluminescent layer. Such an AC short-circuit would cause the device to emit light even when no radiation is incident. Owing to strong light absorption in the thick photoconductive layer, photoconductivity arises only in a thin surface portion and the major part of the photoconductive layer remains in a high resistance state. Hence, a significant part of the voltage applied to the electrodes remains across the photoconductive layer upon irradiation and a high voltage mentioned is used to achieve a sufficient voltage across the electroluminescent layer to cause the emission of radiation. The thick photoconductive layer gives rise to a response time of the known device in the order of seconds which is rather slow and the known device is not suitable to form output images of a scene changing within a second. Moreover, the thickness of the photoconductive layer allows charges which are generated by absorption of incident radiation to migrate laterally and this adversely affects the spatial resolution of the known device.

The known solid-state image intensifier is moreover not suitable for use in an x-ray examination apparatus. The slow response of the known solid-state image intensifier would necessitate a long x-ray exposure period to form an output image of a patient to be examined.

SUMMARY OF THE INVENTION

It is, inter alia, an object of the invention to provide a solid-state image intensifier with a shortened response time.

To achieve this object, an image intensifier according to the invention is characterized in that the electroluminescent layer contains an electroluminescent material which upon application of a low voltage is caused to emit radiation and the photoconductive layer is a thin film.

The response time of the solid-state image intensifier is decreased as the photoconductive layer is made thinner. Since a low voltage is applied to operate the solid-state image intensifier according to the invention, the photoconductive thin film does not suffer from electrical breakdown. Incident radiation may penetrate over a major part of the thickness of the photoconductive thin film which is rendered locally conductive over most of its thickness. Hence, at the irradiated positions the applied low voltage causes emission of radiation because the voltage drop is predominantly over the electroluminescent layer, whereas at the non-irradiated portions the voltage is predominantly across the photoconductive layer and at those portions the voltage drop across the electroluminescent layer is insufficient to cause the electroluminescent layer to give off radiation, e.g. light.

At said low voltage electrons and holes are injected into the electroluminescent layer from opposite sides and recombination of electron-hole pairs within the electroluminescent layer causes emission of radiation. The electroluminescent layer may be-composed of a mixture of a hole-conducting material such as for example polyvinylcarbazole and an electron-conducting material such as for example 2,5-dinaphtyl-1,3,4-oxadiazole and/or 2-(4-biphenyl)-5-(tert.-butylphenyl)-1,3,4-oxadiazole(butyl-PBD) together with an Eu-complex or a Tb-complex as described in the German patent application P4428450.0, or the electroluminescent layer may be formed as a multilayer structure including a hole-conducting layer such as for example N,N'diphenyl-N,N'-bis(3-methylphenyl)-1,1'-biphenyl-4,4'diamine (TPD) and an electron-conducting layer such as for example a butyl-PBD or 8-hydroxyquinolin-aluminum. As an alternative multilayer structure there may be employed an inert polymer matrix comprising a charge conducting substance and/or an electroluminescent material. In such a multilayer structure electrons and holes will pass through the device until they encounter an interface between the electron-conducting layer and the hole-conducting layer. Further charge transport is blocked there such that recombination can take place at the interface with a high efficiency. Such multilayer structures compresing layers of charge transport material and electroluminescent layers may be disposed by vacuum evaporation as described in more detail in the German patent application P4428450.0.

Moreover, as the photoconductive layer is a thin film, lateral migration of charges in the photoconductive layer is limited and hence the spatial resolution of the solid-state image intensifier is improved.

A preferred embodiment of a solid-state image intensifier according to the invention is characterized in that the electroluminescent layer comprises a polymer light-emitting diode material.

Polymer light emitting diode materials show a rectifying behavior, current is passed through them when a low dc voltage of suitable polarity is applied. Such polymer LED material gives off light due to electron-hole recombination when a low dc voltage is applied. Polymer light emitting diode materials are known per se from the article *'Light-emitting diodes based on conjugated polymers'* by J. H. Burroughs et al. in Nature 347(1990)539.

The wavelength of the emitted radiation is selected with suitable chemical substitutions on the polymer; such substitutions do not substantially influence the efficiency of the electroluminescence. Thus, the use of a polymer light emitting diode has as an additional advantage that the color of light-emitting by the solid-state image intensifier may be selected from a wide range and hence the color can be adapted to, for example, the color-dependence of the sensitivity of an image sensor or of the human eye.

Moreover, polymer materials may easily be disposed on a large area of an electrode so that large area solid-state image intensifiers may be manufactured with a substantial yield and at low cost.

A further preferred embodiment of a solid-state image intensifier according to the invention is characterized in that an intermediate layer which is opaque for radiation generated in the electroluminescent layer is positioned between the photoconductive layer and the electroluminescent layer, and in that the intermediate layer is continuous and has a lateral electrical resistance being sufficient to achieve a substantial lateral electrical decoupling of portions of the intermediate portions of the intermediate layer.

The intermediate layer prevents penetration of radiation which is given off by the electroluminescent layer into the photoconductive layer. Hence, radiation generated in the electroluminescent layer cannot give rise to feedback to the photoconductive layer and perturbations resulting from such feedback are avoided.

It is technologically simple to form the intermediate layer as a continuous layer e.g. by sputtering. Portions of the intermediate layer at different lateral positions are electrically decoupled since spreading along the intermediate layer of charge carriers which are generated in the photoconductive layer by absorption of incident radiation is inhibited by the lateral electrical resistance of the intermediate layer. The intermediate layer may for example consist of a high resistance material having a thickness of a few μm. Hence, loss of spatial resolution of the solid-state image intensifier due to lateral spreading of charge carriers in the intermediate layer is substantially reduced.

A further preferred embodiment of a solid-state image intensifier according to the invention is characterized in that an intermediate layer which is opaque for radiation generated in the electroluminescent layer is positioned between the photoconductive layer and the electroluminescent layer, and in that intermediate layer comprises electrically conductive patches which are separated by an electrically insulating substance.

The charge carriers which are generated by absorption of incident radiation in the photoconductive layer are guided by the electric field due to the applied voltage toward the electrically conductive patches of the intermediate layer. The electrically conductive patches are separated by an electrically insulating substance so that the charge carriers are substantially unable to migrate between the patches. Upon irradiation of the solid-state image intensifier the voltage drop is predominantly over the electroluminescent layer at portions which are between each electrically conductive patch and between the electrode facing the electroluminescent layer. Current can pass only locally through portions of the polymer light-emitting diode material of the electroluminescent layer between each of the patches and the electrode facing the electroluminescent layer and said portions are caused to give-off radiation. Hence, the patches constitute pixels of the output-image and the size of the patches determines the spatial resolution of the solid-state image intensifier which spatial resolution is increased as the size of the patches is smaller.

A further preferred embodiment of a solid-state image intensifier according to the invention is characterized in that the thickness of the electroluminescent layer is small enough so that radiation exits the electroluminescent layer close to the lateral position where the radiation is generated in the electroluminescent layer.

The radiation generated in the electroluminescent layer is emitted in a wide range of directions. Because the electroluminescent layer is thin, radiation does not migrate very far before exiting the electroluminescent layer. Hence, the radiation exits the electroluminescent layer close to the lateral position where the radiation is generated. The photoconductive layer is formed as a thin film and therefore hardly decreases the spatial resolution of the solid-state image intensifier. The spatial resolution is further improved by making the electroluminescent layer thin so that the generated radiation is prevented from migrating laterally before exiting the electroluminescent layer. Preferably, the thickness of the electroluminescent layer is so small that radiation does not migrate within the electroluminescent layer over distances larger than distances between pixels or than the size of image-structures of the output image. In particular, the thickness of the electroluminescent layer is less than 100 nm or even less than 50 nm when the electroluminescent layer comprises a polymer light-emitting diode material.

In a further preferred embodiment of a solid-state image intensifier according to the invention the photoconductive layer is sensitive to x-radiation.

A solid-state image intensifier according to the invention is suitable for use as an x-ray detector when the photoconductive layer is chosen so as to be responsive to incident x-radiation. An advantage of a solid-state image intensifier as an x-ray detector is that it is driven by a simple DC low-voltage source and it is less bulky and less complicated than a conventional image intensifier vacuum tube, that incorporates an electron-optical system with a high voltage source.

A further preferred embodiment of a solid-state image intensifier according to the invention is characterized in that the solid-state image intensifier comprises a conversion layer for converting incident x-radiation into radiation to which the photoconductive layer is responsive.

A solid state image intensifier according to the invention is suitable for use as an x-ray detector when a scintillator layer is provided for conversion of incident x-radiation into radiation to which the photoconductive layer is responsive. Such an arrangement has as an advantage that the photoconductive layer may be chosen so as to form an optimum combination with the electroluminescent layer in respect of the properties of the solid-state image intensifier, such as e.g. its time response. The selection of the photoconductive layer is then not limited to only x-ray sensitive materials. Moreover, such a solid-state image intensifier is driven by a simple dc low-voltage source and is less bulky and less complicated than a conventional x-ray image intensifier tube.

The invention further relates to an x-ray examination apparatus comprising an x-ray source, an x-ray detector for detecting an x-ray image made by irradiating an object with an x-ray beam from the x-ray source. An x-ray examination apparatus according to the invention is characterized in that the x-ray detector is a solid-state image intensifier as aforementioned.

An x-ray examination apparatus comprising a solid-state image intensifier according to the invention has as an advantage that such an x-ray examination apparatus is less bulky and less complicated than an x-ray examination apparatus comprising a conventional x-ray image intensifier tube.

A preferred embodiment of an x-ray examination apparatus comprising an image sensor for converting an output image of the solid-state image intensifier into an electronic image signal according to the invention is, characterized in that the electroluminescent layer comprises a polymer light-emitting diode material for emitting light having a wavelength selected to match the wavelength dependence of the sensitivity of the image sensor.

The wavelength of the light emitted by the polymer light emitting diode material is selected with suitable chemical substitutions on the polymers. In particular, the wavelength may be selected so as to correspond to a wavelength for which the image sensor has its greatest sensitivity so that the image sensor supplies an electronic image signal having a significant amplitude even for a low intensity of the light from the polymer light-emitting diode material. Hence, the x-ray dose, which is to some extent harmful for living tissue, required to obtain an image of adequate diagnostic quality of a patient which is examined may be reduced.

DETAILED DESCRIPTION OF THE PREFERRED EMBODIMENTS

Figure 1:
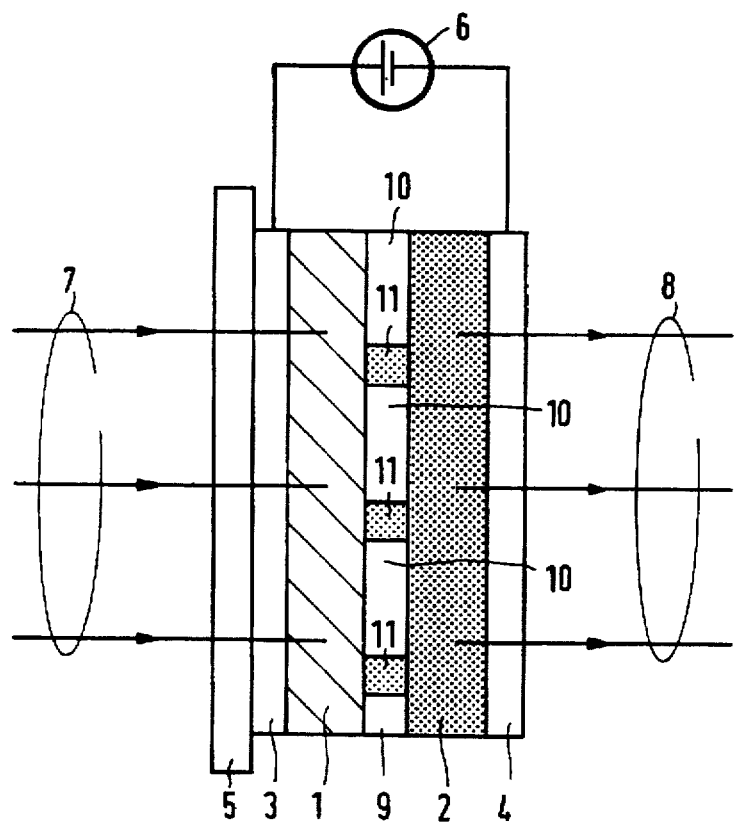
FIG. 1 is a cross-sectional side elevation of a solid-state image intensifier according to the invention.

FIG. 1 is a cross-sectional side elevation of a solid-state image intensifier according to the invention. A photoconductive layer 1 and an electroluminescent layer 2 are provided between a pair of spaced apart electrodes 3,4. One of the electrodes, here the electrode 3 which is closest to the photoconductive layer 1, is mounted to a glass substrate 5. A dc voltage source 6 is coupled to the electrodes 3, 4 to apply a low voltage up to a few tens of Volts over the photoconductive layer 1 and the electroluminescent layer 2. Preferably a voltage in the range between 4V to 20V is applied. The electrode 4 is transparent for light generated in the electroluminescent layer 2 and serves to inject holes into the electroluminescent layer and therefore the electrode 4 is composed of a transparent material with a high work function such as indium-tin oxide. When no radiation is incident on the solid-state image intensifier the photoconductive layer 1 is in a high resistance state and the voltage drop is almost entirely across the photoconductive layer 1. At positions where radiation 7 is incident, the photoconductive layer 1 is rendered conductive and the voltage drop is then predominantly across the electroluminescent layer 2 and causes the electroluminescent layer 2 to give off light 8. The incident radiation 7 may, for example include x-rays, infrared, ultraviolet or visible radiation, and the photoconductive layer 1 is responsive to such radiation. Typical photoconductive materials include for example Cadmium-Selenide, Cadmium-Sulfide or Selenium. These photoconductive materials are sensitive to x-rays. Moreover, photo-electrons that are generated in said materials are multiplied at the low voltages so that a solid state image intensifier according to the invention has an amplification ratio larger than 1, i.e. on average a single input photon is converted into a plurality of output photons. The photoconductive layer is a thin film having a thickness between less than 0.5μm and several μm (i.e. less than 10 μm). In the solid-state image intensifier according to the invention the electroluminescent layer 1 is composed of a polymer light emitting diode (LED) material. Preferably, the thickness of the electroluminescent layer of polymer LED material is less than 100 nm or even less than 50 nm. A solid-state image intensifier with a polymer light emitting diode material shows emission of radiation with an efficiency of about 10% to 25% or higher at a voltage less than about 20V. The wavelength and therefore the color of the light given off by the polymer LED material is selected with suitable chemical substitutions on the polymers; such substitutions do not substantially influence the efficiency of the electroluminescence. Although the photoconductive layer 1 is a thin film there is no risk for electrical breakdown because only a low voltage is applied to the electrodes, said low voltage being sufficient to cause luminescence of the electroluminescent layer 2. The response time of the solid-state image intensifier is short because the photoconductive layer 1 is made thinner. The response time depends on the intensity of the incident radiation. Provided that the intensity of the incident radiation is not too low, the response time is as short as a few milliseconds. The photoconductive thin film 1 is preferably made by sputtering which allows good control over the material properties of a thin film.

Preferably an intermediate layer 9 is provided between the electroluminescent layer 2 and the photoconductive layer 1. The intermediate layer 9 is opaque to luminescence radiation generated in the electroluminescent layer 2. Hence, feedback of the electroluminescent layer 2 to the photoconductive layer 1 is inhibited and perturbations caused by such feedback are substantially avoided. The intermediate layer further serves to inject electrons into the electroluminescent layer and therefore contains a material with a low work function such as for example Calcium or a Magnesium-Silver alloy. The intermediate layer 9 may be a continuous layer having a high lateral electrical resistance or it may include electrically conductive patches 10 which are separated by electric insulators 11. The electrically conductive patches may be formed as a metalfilm as thin as 10 nm. Charge carriers generated by absorption of incident radiation in the photoconductive layer 1 are guided towards the conductive patches under the influence of the electric field due to the applied DC voltage. As the photoconductive layer 1 is a thin film, lateral migration of charge carriers in the photoconductive layer 1 is limited. The insulators 11 prevent lateral spreading of the charge carriers along the intermediate layer 9. Current can pass through the polymer LED material of the electroluminescent layer 2 between each of the patches 10 and the electrode 4. Then electron-hole recombination occurs which gives rise to generation of photons. The electron-hole recombination is a fast process which has a typical time scale of ns. Consequently, the use of a polymer light emitting diode material leads to a solid-state image intensifier of which the response time is further reduced relative to the response time of a conventional solid-state image intensifier. The size of patches may be made as small as 10μm so that the spatial resolution is increased to about 50 lines/mm.

Figure 2:
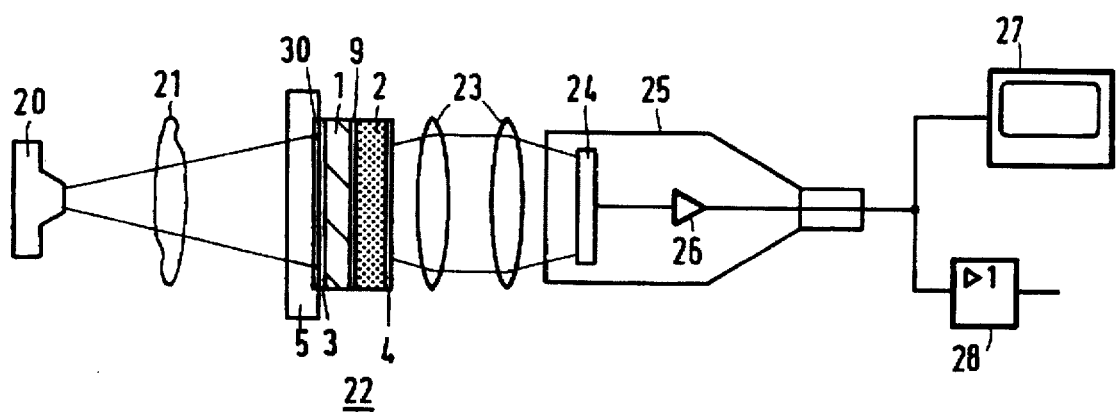
FIG. 2 shows a diagram of an x-ray examination apparatus comprising a solid-state image intensifier according to the invention.

FIG. 2 shows a diagram of an x-ray examination apparatus comprising a solid-state image intensifier according to the invention. An x-ray source 20 emits an x-ray beam to an object 21 so as to form an x-ray image on the substrate 5 of a solid-state image intensifier 22 according to the invention. The solid-state image intensifier converts the x-ray image into a visible light image. The visible light image that is formed on the polymer LED material of the electroluminesccent layer 2 is imaged by an optical system 23 onto an image sensor 24 of a video camera 25. The polymer LED material is preferably adapted to a range of wavelengths for which the sensitivity of the image sensor is large. This is notably achieved with suitable chemical substitutions on the polymer which determine the color of the light given off by the polymer LED material. The intermediate layer 9 is shown in FIG. 2 as a continuous layer having a lateral electrical resistance which is sufficient to substantially inhibit lateral spreading of charge carriers in the intermediate layer, but the intermediate layer may also be formed to contain conducting patches which are separated by an electrically insulating substance. The image sensor 24 derives an electronic image signal from the visible light image. The electronic image signal is amplified by an amplifier 26 forming a video signal which may be applied to a monitor 27 for display of the image or to a buffer circuit 28 for further processing. A scintillator layer 30 is provided to convert the x-radiation into radiation, e.g. green blue or ultraviolet light to which the photoconductive thin film 1 is responsive. The scintillator layer is formed for example from Caesium-iodide which is activated with sodium or thallium(CsI:Na, or CsI:Tl). Instead of providing a scintillating layer the photoconductive thin film may be composed with a material, such as Cadmium-selenide or Selenium, which is responsive to x-rays.

I claim:

1. A solid-state image intensifier comprising a pair of spaced apart electrodes and a photoconductive layer coupled to an electroluminescent layer which are positioned in the space between the electrodes, characterized in that the electroluminescent layer contains an electroluminescent material which upon application between the electrodes of only a low DC voltage in the range of 4V to 20V, and of suitable polarity, is caused to emit radiation and the photoconductive layer is a thin film.

2. A solid-state image intensifier as claimed in claim 1, characterized in that the electroluminescent layer comprises a polymer light-emitting diode material.

3. A solid state image intensifier as claimed in claim 2, characterized in that an intermediate layer which is opaque for radiation generated in the electroluminescent layer is positioned between the photoconductive layer and the electroluminescent layer, and in that the intermediate layer is continuous and has a lateral electrical resistance being sufficient to achieve a substantial lateral electrical decoupling of portions of the intermediate layer.

4. A solid-state image intensifier as claimed in claim 2, characterized in that an intermediate layer which is opaque for radiation generated in the electroluminescent layer is positioned between the photoconductive layer and the electroluminescent layer, and in that intermediate layer comprises electrically conductive patches which are separated by an electrically insulating substance.

5. A solid-state image intensifier as claimed in claim 2, characterized in that the thickness of the electroluminescent layer is small enough so that radiation exits the electroluminescent layer close to the lateral position where the radiation is generated in the electroluminescent layer.

6. A solid-state image intensifier as claimed in claim 2, wherein the photoconductive layer is sensitive to x-radiation.

7. A solid-state image intensifier as claimed in claim 1, characterized in that an intermediate layer which is opaque for radiation generated in the electroluminescent layer is positioned between the photoconductive layer and the electroluminescent layer, and in that the intermediate layer is continuous and has a lateral electrical resistance being sufficient to achieve a substantial lateral electrical decoupling of portions of the intermediate layer.

8. A solid-state image intensifier as claimed in claim 7, characterized in that the thickness of the electroluminescent layer is small enough so that radiation exits the electroluminescent layer close to the lateral position where the radiation is generated in the electroluminescent layer.

9. A solid-state image intensifier as claimed in claim 7, wherein the photoconductive layer is sensitive to x-radiation.

10. A solid-state image intensifier as claimed in claim 1, characterized in that an intermediate layer which is opaque for radiation generated in the electroluminescent layer is positioned between the photoconductive layer and the electroluminescent layer, and in that intermediate layer comprises electrically conductive patches which are separated by an electrically insulating substance.

11. A solid-state image intensifier as claimed in claim 10, characterized in that the thickness of the electroluminescent layer is small enough so that radiation exits the electroluminescent layer close to the lateral position where the radiation is generated in the electroluminescent layer.

12. A solid-state image intensifier as claimed in claim 10, wherein the photoconductive layer is sensitive to x-radiation.

13. A solid-state image intensifier as claimed in claim 1, characterized in that the thickness of the electroluminescent layer is small enough so that radiation exits the electroluminescent layer close to the lateral position where the radiation is generated in the electroluminescent layer.

14. A solid-state image intensifier as claimed in claim 13, wherein the photoconductive layer is sensitive to x-radiation.

15. A solid-state image intensifier as claimed in claim 1 wherein the photoconductive layer is sensitive to x-radiation.

16. An x-ray examination apparatus comprising an x-ray source, an x-ray detector for detecting an x-ray image made by irradiating an object with an x-ray beam from the x-ray source, characterized in that the x-ray detector is a solid-state image intensifier according to claim 15.

17. An x-ray examination apparatus as claimed in claim 16, comprising an image sensor for convening an output image of the solid-state image intensifier into an electronic image signal, characterized in that the electroluminescent layer comprises a polymer light-emitting diode material for emitting light having a wavelength selected to match the wavelength dependence of the sensitivity of the image sensor.

18. A solid state image intensifier as claimed in claim 1, characterized in that the solid-state image intensifier comprises a conversion layer for converting incident x-radiation into radiation to which the photoconductive layer is responsive.

19. An x-ray examination apparatus comprising an x-ray source, an x-ray detector for detecting an x-ray image made by irradiating an object with an x-ray beam from the x-ray source, characterized in that the x-ray detector is a solid-state image intensifier according to claim 18.

20. An x-ray examination apparatus as claimed in claim 19, comprising an image sensor for converting an output image of the solid-state image intensifier into an electronic image signal, characterized in that the electroluminescent layer comprises a polymer light-emitting diode material for emitting light having a wavelength selected to match the wavelength dependence of the sensitivity of the image sensor.

* * * * *